US008823723B2

(12) United States Patent
Katsukura et al.

(10) Patent No.: US 8,823,723 B2
(45) Date of Patent: Sep. 2, 2014

(54) SEMICONDUCTOR INTEGRATED CIRCUIT DEVICE, FACILITY APPLIANCE CONTROL DEVICE, AND APPLIANCE STATE DISPLAY APPARATUS

(75) Inventors: Makoto Katsukura, Chiyoda-ku (JP); Masanori Nakata, Chiyoda-ku (JP); Noriyuki Kushiro, Chiyoda-ku (JP); Yoshiaki Koizumi, Chiyoda-ku (JP); Toshiaki Kikuta, Chiyoda-ku (JP); Takuya Mukai, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 162 days.

(21) Appl. No.: 13/000,096

(22) PCT Filed: Apr. 14, 2009

(86) PCT No.: PCT/JP2009/057475
§ 371 (c)(1),
(2), (4) Date: Dec. 20, 2010

(87) PCT Pub. No.: WO2010/016299
PCT Pub. Date: Feb. 11, 2010

(65) Prior Publication Data
US 2011/0102317 A1    May 5, 2011

(30) Foreign Application Priority Data

Aug. 7, 2008   (JP) ................. 2008-204374
Oct. 2, 2008   (JP) ................. 2008-257526

(51) Int. Cl.
*G06G 5/00*    (2006.01)

(52) U.S. Cl.
USPC ......................................................... 345/581

(58) Field of Classification Search
CPC ....................................................... G06T 11/00
See application file for complete search history.

(56) References Cited

U.S. PATENT DOCUMENTS

| 5,440,682 A | 8/1995 | Deering |
| 5,553,224 A * | 9/1996 | Saund et al. .................. 345/619 |
| 5,572,239 A | 11/1996 | Jaeger |
| 5,613,053 A * | 3/1997 | Albers et al. .................. 345/443 |

(Continued)

FOREIGN PATENT DOCUMENTS

| JP | 4-314133 A | 11/1992 |
| JP | 6-35848 A | 2/1994 |

(Continued)

OTHER PUBLICATIONS

International Search Report (PCT/ISA/210) issued on Jun. 30, 2009, by Japanese Patent Office as the International Searching Authority for International Application No. PCT/JP2009/057475.

(Continued)

*Primary Examiner* — Edward Martello
(74) *Attorney, Agent, or Firm* — Buchanan Ingersoll & Rooney PC

(57) ABSTRACT

An application program changes a property value of a graphic object arranged in an object database. An object manager reads out the property value from the object database and then issues a drawing command. A graphics engine executes the drawing command to configure a memory image of the graphic object on a VRAM to display the image on a liquid crystal display via an LCDC.

9 Claims, 12 Drawing Sheets

(56) References Cited

U.S. PATENT DOCUMENTS

| | | | | |
|---|---|---|---|---|
| 5,748,947 | A | * | 5/1998 | Fukushima ............... 345/501 |
| 5,977,997 | A | * | 11/1999 | Vainsencher ............. 345/519 |
| 6,026,485 | A | * | 2/2000 | O'Connor et al. .......... 712/226 |
| 6,996,813 | B1 | * | 2/2006 | Sokolov et al. ........... 717/148 |
| 7,533,250 | B2 | * | 5/2009 | Chauvel et al. ........... 712/226 |
| 2002/0091830 | A1 | | 7/2002 | Muramatsu |
| 2002/0153993 | A1 | | 10/2002 | Inada et al. |
| 2002/0171624 | A1 | * | 11/2002 | Stecyk et al. ............. 345/156 |
| 2003/0023958 | A1 | | 1/2003 | Patel et al. |
| 2004/0041813 | A1 | * | 3/2004 | Kim ........................... 345/519 |
| 2005/0091615 | A1 | * | 4/2005 | Suzuki ....................... 715/863 |
| 2007/0179641 | A1 | * | 8/2007 | Lucas et al. ................ 700/83 |
| 2010/0017711 | A1 | * | 1/2010 | Aso et al. .................. 715/708 |

FOREIGN PATENT DOCUMENTS

| | | | |
|---|---|---|---|
| JP | 6-348854 | A | 12/1994 |
| JP | 7-093119 | A | 4/1995 |
| JP | 9-505163 | A | 5/1997 |
| JP | 9-319538 | A | 12/1997 |
| JP | 2001-229794 | A | 8/2001 |
| JP | 2002-208016 | A | 7/2002 |
| JP | 2003-280799 | A | 10/2003 |
| JP | 2004-522236 | A | 7/2004 |
| JP | 2004522236 | A | 7/2004 |
| JP | 2006-073311 | A | 3/2006 |
| JP | 2006-128854 | A | 5/2006 |
| JP | 2006277105 | A | 10/2006 |
| JP | 2007101933 | A | 4/2007 |
| JP | 2008504611 | A | 2/2008 |
| JP | 2008-213343 | A | 9/2008 |
| WO | 03/014921 | A1 | 2/2003 |
| WO | 2006/004682 | A2 | 1/2006 |

OTHER PUBLICATIONS

Office Action from Chinese Patent Office dated Nov. 29, 2012, issued in corresponding Chinese Patent Application No. 200980129075.7, with English translation thereof.

Chinese Office Action (Notification of Reasons for Rejection) dated Feb. 23, 2012, issued in the corresponding Chinese Patent Application No. 200980129075.7, and a partial English Translation thereof. (8 pages).

Office Action dated Aug. 15, 2012, issued by the Chinese Patent Office in the corresponding Chinese Patent Application No. 200980129075.7 and an English translation thereof. (4 pages).

Office Action from the Japan Patent Office dated Feb. 26, 2013, issued in corresponding Japanese Patent Application No. 2010-523784, with English translation thereof.

Office Action from the Japan Patent Office dated May 28, 2013, issued in corresponding Japanese Patent Application No. 2010-523784, with English translation thereof. (10 pages).

Japanese Office Action (Notice of Reasons for Rejection) dated Feb. 25, 2014, issued by the Japanese Patent Office in corresponding Japanese Patent Application No. 2013-092457 and English language translation. (5 pages).

Chinese Office Action issued in corresponding Chinese Patent Application No. 201210206711.5 dated Jul. 14, 2014, English translation 8 pages.

* cited by examiner

F I G. 6
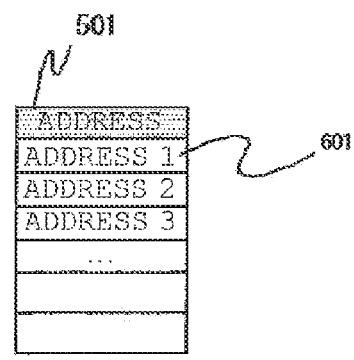

F I G. 8

US 8,823,723 B2

SEMICONDUCTOR INTEGRATED CIRCUIT DEVICE, FACILITY APPLIANCE CONTROL DEVICE, AND APPLIANCE STATE DISPLAY APPARATUS

TECHNICAL FIELD

The present invention relates to a semiconductor integrated circuit device which, draws a graphic object of a graphical user interface, and a facility appliance control device using the same.

Also, the present invention relates to an operating device and an operating method, which can be used for state display devices of various kinds of appliances.

BACKGROUND ART

In recent years, graphical interfaces (GUIs) have become common because of widespread use of liquid crystal panels. Until now, GUIs, which have been used only in powerful computers and so on, are gradually spreading into built-in appliances. This is because the use of GUIs has advantages of suppressing an increase in number of switches or the like due to the advanced features of built-in appliances, allowing the user to operate the appliances without difficulty, and so on. This trend may persist in the future too.

However, arithmetic processors such as microcomputers, with low processing power have still been used in the built-in devices from the viewpoint of cost-effectiveness, heat generation, and power consumption. A GUI processing requires a large number of instructions and consumes most CPU resources, affecting the performance of an original application program, such as the delay of start-up thereof. There are strict requirements for the built-in devices and this trend may persist in the future too.

To address such a problem, it has been proposed that part of a software process is replaced with a logic circuit using FPGA to reduce the CPU resource consumption (see, for example, Patent Document 1). The logic circuit performs a process without decoding of instructions. Thus, the logic circuit can effectively performs the process at a high speed, compared with one carried out by the software.

Other methods have been also proposed. In these methods, part of a drawing processing is replaced with a dedicated hardware in the unit of drawing instructions such as "line drawing" and "color calculation". These methods have been commercialized under the name of "graphic accelerators" (see, for example, Patent Document 2).

Nowadays, furthermore, while it becomes difficult to operate appliances such as air-conditioning appliance and household electrical appliance by some buttons thereon because of the multi-functionality of the appliances, graphical user interfaces allow manufacturers to manufacture appliances that satisfy both multi-functionality and usability. In addition, the operability of the graphical user interfaces allows users to use the basic functions of the appliances without difficulty and also the applied functions thereof. Thus, the operability of the graphical user interfaces leads to enhanced convenience of the users. However, from the viewpoint of manufacturing cost, the display devices of these appliances have significant limitations on the display contents to a liquid crystal and the operating device thereof. In recent years, so-called soft keys have been effective alternatives to input buttons assigned to particular operations, such as "START/STOP" and "WARMING". The soft key, however, is dynamically assigned to any of functions brought up on the screen. In this case, the more the representation on the screen nears the "soft key" button, the more intuitively a user operates the appliance. In fact, however, the screen and the button are distant from each other in most cases because of the restricted configuration of a liquid crystal display unit.

To realize intuitive operation, for example, a method using magnetism has been proposed in documents, such as Patent Document 3.

PRIOR ART DOCUMENTS

Patent Documents

Patent Document 1: Japanese unexamined Patent application Publication No. 4-314133
Patent Document 2: Japanese unexamined Patent application Publication No. 6-348854
Patent Document 3: Japanese unexamined Patent application Publication No. 2001-229794

DISCLOSURE OF INVENTION

Problems to be Solved by the Invention

In recent years, most graphic objects in GUI, such buttons and text boxes, become so complicated that they are drawn by sets of drawing commands. Such contents of drawing are determined by complicated conditions in many cases, and CPU resources are also consumed to issue drawing commands. Here, the phrase "issue drawing commands" means that, for example, when drawing "a hollow square with a width of 10 and a height of 10, and upper left coordinates position X=0 and Y=0", four commands: "draw a straight line from the point (X=0, Y=0) to the point (X=10, Y=0)"; "draw a straight line from the point (X=10, Y=0) to the point (X=10, Y=10)"; "draw a straight line from the point (X=10, Y=10) to the point (X=0, Y=10)"; and "draw a straight line from the point (X=0, Y=10) to the point (X=0, Y=0)" are created and then transferred to a next processing circuit.

In the technology disclosed in Patent Document 1, the process of issuing such commands should be allocated to FPGA and CPU by the developer him or herself using a compile option or the like. Therefore, the developer has an increased load of designing the allocation. Furthermore, in the technology disclosed in Patent Document 2, an application program is required for performing the process of issuing the above drawing commands, so that it takes a long time for the developer.

As described above, the drawing of GUI objects requires high throughput and places a significant burden on a low function CPU. For this reason, acceleration of processing speed is required. However, the conventional methods require much time and effort in the development so as to place large burdens on the developers.

The present invention has been made to solve the above problems. An object of the present invention is to provide an environment that allows a user to comfortably use GUI in a built-in device while suppressing increase in time and cost in the development by fixing an attribute value of the position of a GUI object or the like and separating a process required for drawing from an application.

Furthermore, a prior-art technology has proposed an idea of designing a switch, but poorly corresponded to the "soft key" as described above. Therefore, a further object of the present invention is to realize a "soft key" function by bringing an operation device close to a liquid crystal display part and simplifying the procedures of temperature setting and menu selection by adoption of a device for rotational operation as an operating device.

Means for Solving Problems

The present invention is a semiconductor integrated circuit device for building a graphic user interface. The device includes: a graphic object having a function of a button, a text box, or the like on a screen, which is constructed of a character, a figure, or an image; an object property having attribute information, such as a position of the graphic object on a screen; an object database for storing a plurality of the object properties and arranging them in a rewritable memory; an object manager for issuing a drawing command for drawing the graphic object on the screen with reference to the object properties; and a graphics engine for processing the drawing command to draw the graphic object on the screen. The object database, the graphics engine, and said object manager are mounted on a single semiconductor chip.

The present invention relates to a semiconductor integrated circuit device in which a process for portion related to graphics of a GUI object and a process for an application thereof are separated. The structure of the property of a graphic object is fixed in advance. Between the processing for the application and the processing for the graphics information is shared. Therefore, the processing for the application program and the processing for the graphics can exchange the object property. Thus, the difference of GUI in every application can be flexibly absorbed. In addition, the issue and the management of drawing commands of the GUI object can be implemented in hardware. The application developer does not need to issue a drawing command, such as "Draw a line" when drawing a graphic object such as a button but only change an object property value. Therefore, developers can save time and effort in the development. In addition, part of the process for graphics can be implemented in hardware, thereby enhancing the speed thereof.

Furthermore, an appliance state display apparatus of the present invention includes a liquid crystal display unit and a housing for supporting the liquid crystal display unit, a rotary operation device arranged on the upper surface of the liquid crystal display unit, a magnetic sensor arranged on the upper surface of the housing, and a magnetic body arranged on the rotary operation device.

Advantages

According to the semiconductor integrated circuit device of the present invention, the processing for GUI can be separated from an application. In addition, the time and effort of developers for GUI development can be reduced. Furthermore, the load on CPU can be reduced. Part of the processing for graphics can be implemented in hardware to speed up the processing.

The appliance state display apparatus of the present invention will exert the following effects: The rotation of the rotary operation body can be detected even without a special wiring arranged on the upper surface of the liquid crystal display unit. Since the rotary operation body is close to the contents displayed on the liquid crystal display unit, an operator can intuitively understand the operation to the displayed contents and the response representation by rotary operation.

Even without a special wiring on the upper surface of the liquid display unit, the operator can intuitively understand the operation to the displayed contents and the response representation displayed on the liquid display unit by operating the second magnetic body as a push-down button.

Even if the magnetism of the second magnetic body is small, the movement of the movable member can be detected and estimated.

Furthermore, click-feeling can be obtained as the rotary operation body is made to rotate.

BRIEF DESCRIPTION OF THE DRAWINGS

FIG. 6 is a diagram illustrating the configuration of an object location 501 according to Embodiment 3.

FIG. 8 is a diagram illustrating the operation of an object manager 6 according to Embodiment 4.

BEST MODES FOR CARRYING OUT THE INVENTION

Embodiment 1

Figure 1:
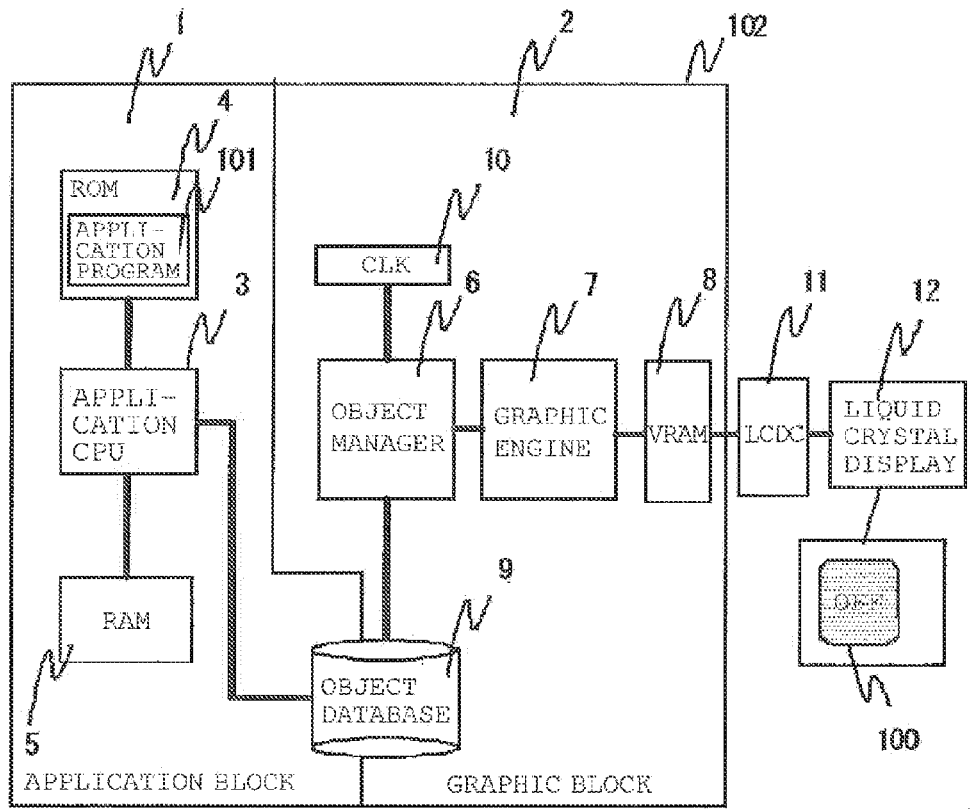
FIG. 1 is a diagram illustrating the configuration of a semiconductor integrated circuit device 102 according to Embodiment 1.

FIG. 1 is a block diagram schematically illustrating Embodiment 1. A semiconductor integrated circuit device 102 of the present embodiment includes an application block 1 and a graphic block 2.

The application block 1 and the graphic block 2 operate according to different clock timing, respectively. In other words, these blocks can operate independently from each other.

The application block 1 and the graphic block 2 are configured so that they can run in parallel. Thus, the graphic block 2 can execute a GUI processing, such as drawing of a graphic object 100, while the application block 1 executes a processing of an application program 101. Therefore, the application program 101 can monopolize the CPU resource of the application block 1.

For example, the application block 1 and the graphic block 2 may be mounted by arranging different cores on a single semiconductor chip, but not limited to such a single semiconductor chip. The block 1 and the block 2 may be arranged on a plurality of semiconductor chips connected to one another. The block 1 and the block 2 arranged on the single semiconductor chip are advantageous in that transmission delay, timing loss, and so on due to information exchange through connection hardly occur, compared with those arranged on a plurality of semiconductor chips.

Similarly, these blocks may be mounted on a complex programmable logic device (CPLD) or a field programmable gate array (FPGA) which can make up a logic circuit, or may be provided as an IC, such as an application specific integrated circuit (ASIC).

Furthermore, similar effects can be obtained by configuring the device using a dual core microprocessor. In this case, separate cores are allocated to the application block 1 and the graphic block 2.

In the application block 1, an application program 101 developed by an application developer runs. The application block 1 includes an application CPU 3, a ROM 4, and a RAM 5. The application program 101 is a GUI-using program. For example, the application program 101 includes a control program for facility appliances, a communication program, and so on. The application program 101 is stored in the ROM 4. Then, when the application CPU 3 comes into operation, the application program 101 is read by the RAM 5 and executed.

Drawing of a GUI screen is carried out in the graphic block 2. The graphic block 2 includes an object manager 6, a graphics engine 7, a VRAM 8, an object database 9, and a CLK 10. The object manager 6 and the object data base 9, the object manger 6 and the graphics engine 7, the graphics engine 7 and the VRAM 8, and the CLK 10 and the object manager 6 are respectively connected via a single or two or more wiring lines for data transmission by electric signals.

Attribute information, such as the position, background color, and so on of a graphic object 100 having functions of a button, a text box, and so on is stored as an object property 15 in the object database 9. The object database 9 is placed in a shared memory which is accessible not only from the application block 1 but also from the graphic block 2.

The object manager 6 reads out the object property 15 from the object database 9. Then the object manager 6 issues a draw command list 16 to deliver it to the graphics engine 7. Here, the draw command list 16 is a cluster of drawing commands for drawing with the graphics engine 7. The object manager 6 is configured to receive instruction for periodically executing a processing by the CLK 10. Furthermore, the CLK 10 controls the execution of the object manager 6 with a trigger timing.

Here, the phrase "to issue a draw command list 16" refers to the generation of drawing commands in a right order with proper arguments contained in the draw command list 16. The drawing commands are output as logic signals to the graphics engine 7 via a data bus and so on.

In this way, the timing of updating the screen can be kept constant as the CLK 10 controls the execution cycle of the object manager 6. If the timing of updating the screen varies, it causes flickering and makes the user uncomfortable.

The graphics engine 7 performs a drawing processing according to the draw command list 16 to configure a memory image 1103 on the VRAM 8. The graphic engine 7 receives commands for the processing of drawing lines, dots, and so on and executes a memory write command to draw memory images.

A memory image on the VRAM 8 is transferred to a liquid crystal display (LCD) 12 via an externally connected LCDC 11. The size of an address space of the VRAM 8 depends on the screen size of the LCD. For example, when the size of the LCD 12 is 640 in width and 480 in length, the number of elements included in the VRAM 8 is 640×480=307200. The number of bytes required by one element is determined by the number of colors which can be displayed on the LCD. The required size of one element is 3 bytes when the LCD corresponds to a 24-bit full color display. In this case, the VRAM 8 should be at least 900 kilobytes. Thus, the size of the VRAM 8 can be designed properly depending on the performance of the LCD.

The LCDC 11 lessens the differences in features and drive method of the liquid crystal display. Therefore, the semiconductor integrated device 102 is not influenced by the difference of the liquid crystal display 12.

The RAM 5 of the application block 1 may be used in common with a RAM where the object database 9 of the graphic block 2 is arranged. In this case, their memory areas are separately allocated in the address spaces to prevent from being overlapped.

In addition, the VRAM 8 may be used in common with the RAM (not shown) where the object database 9 is arranged. In this case, the address space of the VRAM 8 may be used separately from the address space where the object database 9 is arranged.

Figure 2:
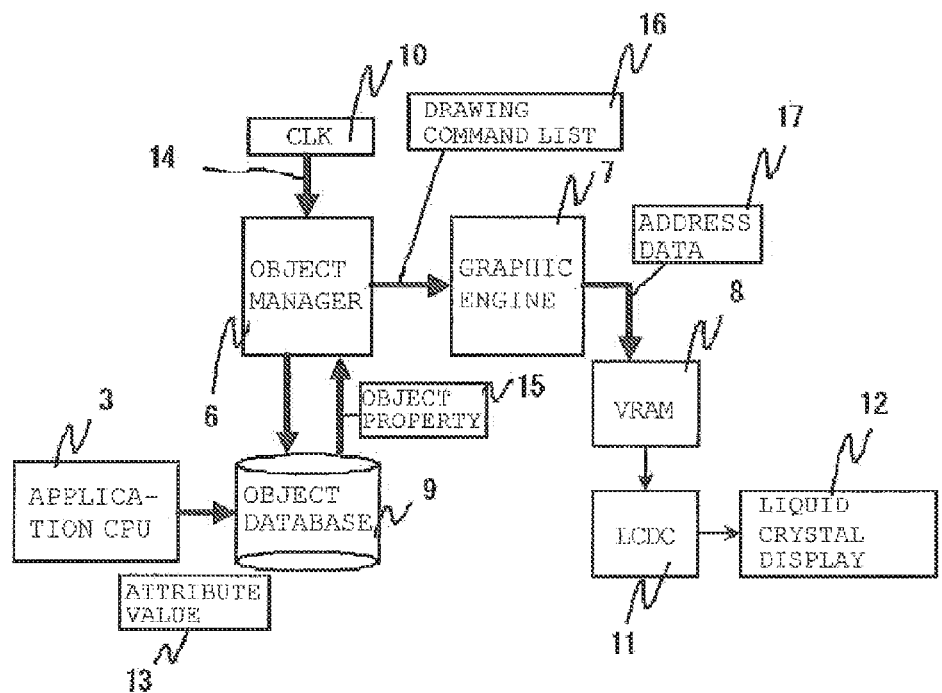
FIG. 2 is a diagram illustrating the operation of a semiconductor integrated circuit device 102 according to Embodiment 1.

FIG. 2 illustrates the operations of the semiconductor integrated circuit device 102 until the drawing of the graphic object 100 on the liquid crystal display 12.

First, the application program 101 running on the application CPU 3 changes an attribute value of the object property 15 when needing to change the behavior of the graphic object 100 such as the position, color, existence of highlighting, existence of display thereof.

When a start trigger 14 of the processing is set from the CLK 10, the object manager 6 reads out the object property 15 from the object database 9 and then issues the drawing command list 16 for drawing the graphic object 100.

The issued drawing command list 16 is transmitted to the graphics engine 7 via a bus or the like. The graphics engine 7 executes the draw command list 16 in sequence to configure a memory image of the graphic object 100 on the VRAM 8. The term "memory image" means a picture image configured on the memory.

The memory image configured on the VRAM 8 is periodically transferred to the LCDC 11 (liquid crystal display controller). The LCDC 11 converts the memory image 1103 into a signal sequence for displaying on the liquid crystal display 12 and then transfers it to the liquid crystal display 12. The signal sequence may be based on any of already standardized specifications, such as NTSC and PAL, or on a unique specification. These conform to the specification of the liquid crystal display 12. Thus, the LCDC 11 corresponding thereto is selected and mounted.

Above operations result in drawing a new screen on the liquid crystal display 12, where the new screen reflects the behavior of the graphic object 100 changed by the application program 101. For example, when the attribute of a character string to be displayed in a text box, which is a graphic object, is changed, the above processing updates the values of the contents of the text box displayed on the screen.

The processing is performed in sequence for all the object properties stored in the object database 9. In other words, the draw command list is issued to each of all the object properties in order.

As described above, a developer can change the behavior of the graphic object 100 on the screen by only making a program of changing the object property 15 on the object database 9. For this reason, the developer is unnecessary for caring about detailed rules and specifications about the processing of graphics, so that the developer can easily configure a program. Therefore, the developer can save time and cost for the development of GUI. The processing related to graphics independent from other processing, so that it can be accelerated.

Furthermore, as described above, by making the processing of the application block 1 independent from that of the graphic block 2, a configuration can be obtained in which mutual processing does not affect each other. Therefore, the processing of the application program 101 can be accelerated up to the same level as when there is no processing related to GUI.

Embodiment 2

Referring now to FIG. 1 to FIG. 4, an object property 15 according to Embodiment 2 of the present invention will be described in detail. In addition, other components are the same with those of the Embodiment 1, so that the description thereof will be omitted herein.

Figure 3:
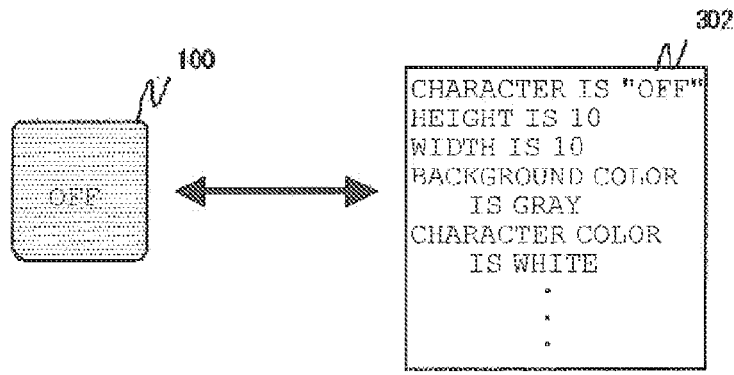
FIG. 3 is an schematic diagram illustrating a graphic object 301.

FIG. 3 illustrates a button object as an example of the graphic object 100. In general, a button part or the like, such as shown in FIG. 3, is used as a graphic object in a personal computer or a built-in device. The button part has various attribute information. For example, the information includes character, height, width, background color, character color, existence of animation, clicking sound, existence of highlighting, ID, name, and so on, written in the button. If such attribute information 302 is defined, then the button object, which is the graphic object 100, can be uniquely reproduced on the liquid crystal display 12. For example, attribute information 302 of the graphic object 100 shown in FIG. 3 includes: a character is "OFF"; the height is 10 pixels; the width is 10 pixels; the color of the background is gray; the color of the character is white; and so on.

Figure 4:
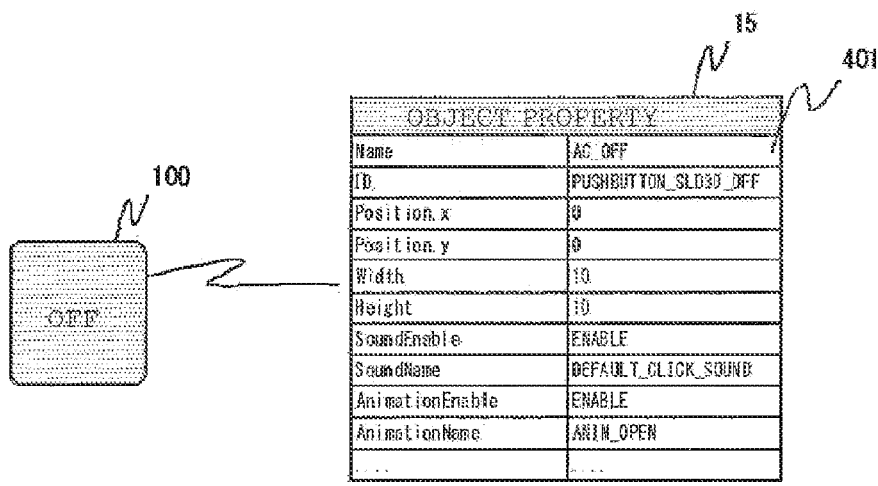
FIG. 4 is a diagram illustrating an example of an object property 15 according to Embodiment 2.

FIG. 4 illustrates an example of the object property 15 of the graphic object 301. Attribute information 302 shown in FIG. 3 is stored in the object database 9 as attribute values 401 of the object property 15 shown in FIG. 4 in the form of numeric values, character strings, and so on. One object property 15 has a plurality of attribute values 401, such as a name, an ID, an X-coordinate position, a Y-coordinate position, a width, a height, the existence of a clicking reproduced sound, a reproduced sound, the existence of animation, the kind of the animation, and so on.

The object properties of the same kind of graphic objects on the memory have their respective configurations which are uniquely determined for each kind. The same kind of graphic objects have the same configuration. The configuration of the object property 15 is defined by an offset or the like from the leading address to each attribute value in the memory space on which the object property 15 is arranged.

As described above, the object property 15 of the graphic object 301 is provided with the attribute information 302, so that any optional property such as an appearance of the graphic object 100 can be changed while the essential features thereof are maintained. Thus, the graphic objects 100 with different appearances can be drawn by the same logic circuit.

In this way, by providing the attribute information 302 of the object as the attribute values 401 in the forms of characters, numeric values, and so on, they can be referred to the logic circuit.

Embodiment 3

Referring now to FIG. 1 to FIG. 6, an object database 9 according to Embodiment 3 of the present invention will be described in detail. In addition, the operations illustrated in FIG. 1 to FIG. 4 are identical to those of the Embodiment 1 and Embodiment 2, so that the description thereof will be omitted herein.

Figure 5:
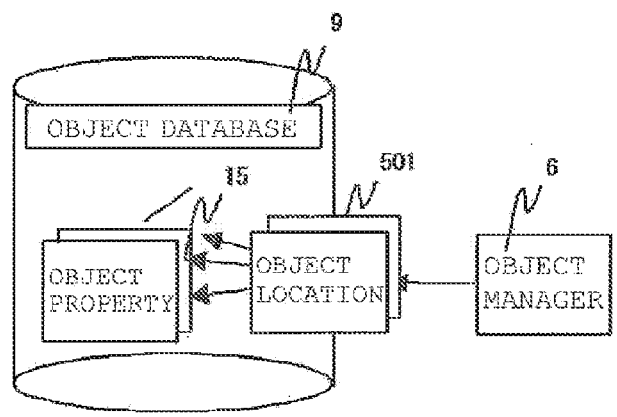
FIG. 5 is a diagram illustrating the configuration of an object database 9 according to Embodiment 3.

FIG. 5 illustrates the configuration of the object database 9. The object data base 9 has two or more object properties 15 and two or more object locations 501. The object location 501 includes the information about the location of the object property 15 in a memory.

The object database 9 is arranged on a rewritable memory (not shown). The object database 9 is configured so that it can be accessed from both the application block 1 and the graphic block 2. For example, the object database 9 can be implemented using a memory or the like which can be accessed from a different core such as DPRAM. Furthermore, regarding a shared memory, an access method to access the same single port RAM (SRAM, DRAM, or the like) using a shared bus is allowable.

The object manager 6 reads out the object property 15 of the graphic object 100 from the object database 9. When the object manager 6 receives a processing start trigger 14 from CLK 10, firstly, the object manger 6 reads an object location 501 and then acquires the position information, such as an address, of the object property 15 on the memory. Next, the object manger 6 accesses the acquired address on the memory and then reads out the object property 15. To read out the object property 15 means that all the attribute values of the object property are transferred from the object database 9 to the object manager 6.

The object manager 6 has the information about the configuration of the object property 15 on the memory. The configuration of the object property 15 is designed by a designer before determining the circuit of the object manager 6. The configuration of the object property 15 is unique for each kind of the graphic object. The same kind of graphic object is prevented from having a different memory configuration.

When the application block 1 and the graphics block 2 share the configuration of the object property 15 on the memory, an exchange of data can be independently performed between the two blocks via the graphics database 9.

Thus, the behavior of the graphic object 100 can be dynamically changed by arranging the object database 9 on a rewritable RAM. For example, the behavior of the graphic object 100, such as the position thereof and the existence of highlighting, can be changed during the execution of the program.

As described above, when the object database 9 is arranged on the shared memory which can be accessed from both the application block 1 and the graphic block 2, the attribute of the graphic object can be changed while keeping their respective processing independent from each other.

The object property has a different configuration according to the types of graphic objects. For example, the object properties of a button and a text box have a different configuration. Therefore, there are as many object properties as the types of graphic objects. It is noted that the graphic objects of the same type have the same project property configuration. For example, if button 1 and button 2 are a "button" of the same graphic object, the object property configuration of the button 1 and button 2 are the same.

The object location 501 varies with type of the graphic object and the graphic objects of the same type are managed by one object location.

FIG. 6 illustrates an implementation example of the object location. One object location 501 has a plurality of object property addresses 601. The object property addresses 601 store addresses on the memory where the object properties of the same type are arranged.

Thus, by collectively managing all the address of the object property 15 by the object location 501, the object manager 6 can accesses the object property 15 as long as the object manager 6 only knows the position of the object location 501.

Embodiment 4

Referring now to FIG. 1 to FIG. 9, an object manager 6 according to Embodiment 4 of the present invention will be described in detail. In addition, the operations illustrated in FIG. 1 to FIG. 6 are identical to those of the Embodiment 1 to Embodiment 3, so that the description thereof will be omitted herein.

Figure 7:
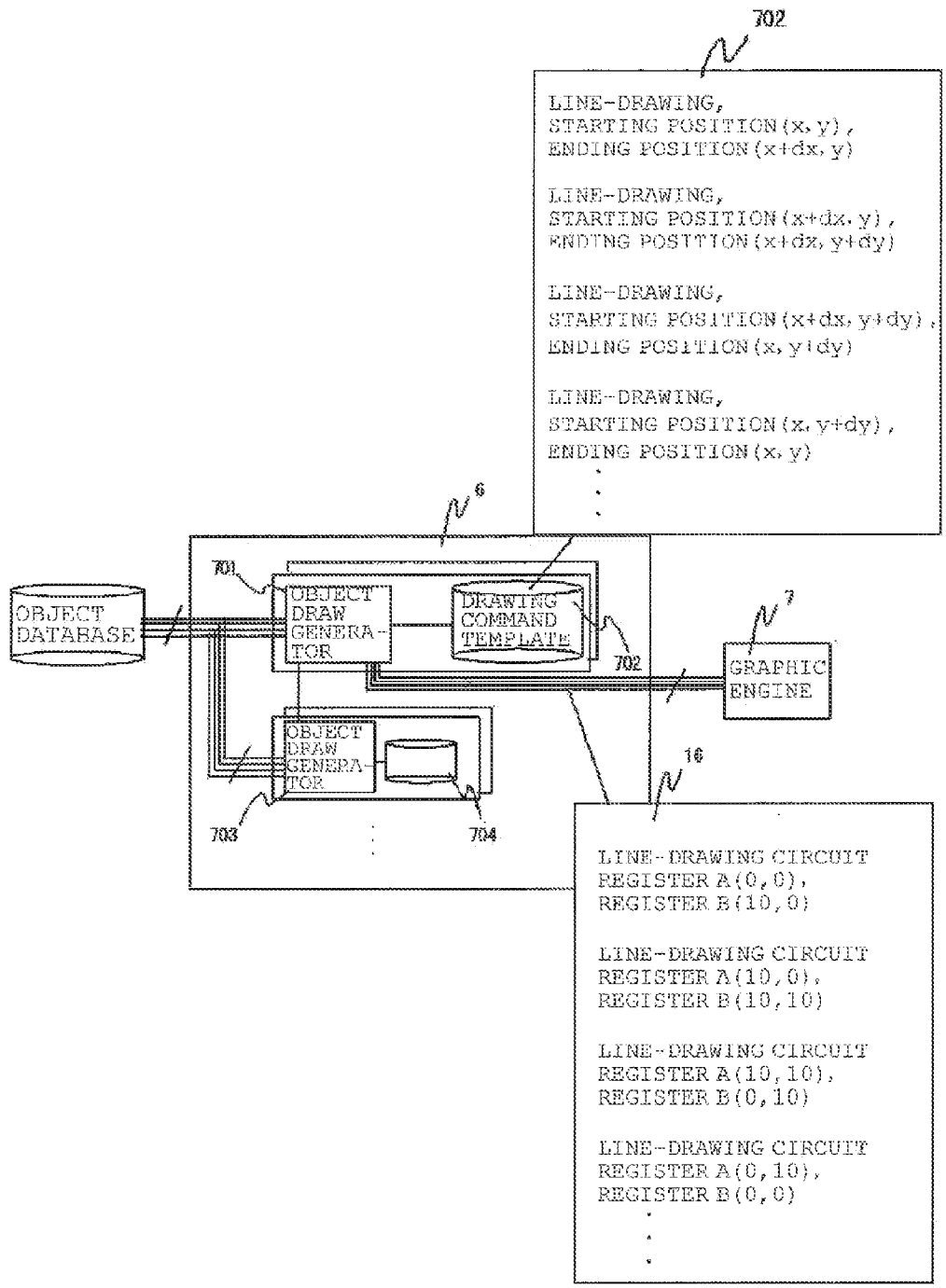
FIG. 7 is a diagram illustrating an example of an object manager 6 according to Embodiment 4.

FIG. 7 illustrates the configuration of the object manager 6. The object manager 6 includes sets of an object draw generator 701 that issues a drawing command and an object draw template 702 that includes the type information of the issued drawing command.

The object draw generator 701 is configured by a logic circuit and so on. The object draw generator is implemented as a different circuit for every graphic object type. The object draw generator 701 issues a draw command list 16, a cluster of drawing commands for drawing a graphic object 100, by changing a predetermined portion of the object draw template 702. The object draw generator 701 connects to the object database 9 and the graphics engine 7.

The object manager 6 has a reference type object draw generator 703. The reference type object draw generator 703 connects to the object database 9 and the object draw generator 701. The reference type object generator 703 draws a multiple graphic object configured by two or more buttons. In the draw command template 704, which is owned as a set by the reference type object draw generator 703, a command for drawing other graphic object is described, such as "Draw a button object". When the reference object generator 703 reads such a command, the reference object generator 703 transfers part of the object property to the object draw generator 701 and makes it draw a graphic object.

In the draw command template 702, most of the drawing commands for drawing applicable graphic objects 100 are prepared in a list. These commands lack, for example, information about the starting point of drawing a line and the assigned color. Thus, such information is supplemented to complete a draw command list 16.

The object manager 6 has the information about the configuration of the object property 15 on the memory in advance. The configuration of the object property 15 is designed by a designer before deciding the circuit of the object manager 6. The configuration of the object property 15 is unique for each kind of the graphic object. The same kind of graphic objects is prevented from having a different memory configuration.

FIG. 8 illustrates the operation of the object manager 6 to read out the object property 15 of the graphic object 100 from the object database 9. When receiving processing start trigger from the CLK 10, the object manger 6 transmits a command meaning reading out an address to the object database. The object manger 6 reads out an address where the object location 501 is arranged and then acquires the arrangement position of the object property 15 on the memory. The object manager 6 knows the position of the object location 501 which is predetermined by a designer. Next, the object manager 6 specifies the front address of the location of the acquired object property 15 arranged in the memory and then reads out the initial data of the object property 15. Similarly, furthermore, the object manager 6 reads out data while increasing the address one by one in sequence. The object manager 6 stops reading processing when completing the read of the last data of the object property 15, then moves to issue processing of the next drawing command.

By possessing configuration information of the object property 15 on the memory, the object manager 6 can acquire the front address of the object property 15 from the object location 501 and read out a predetermined attribute value of the object property 15.

Figure 9:
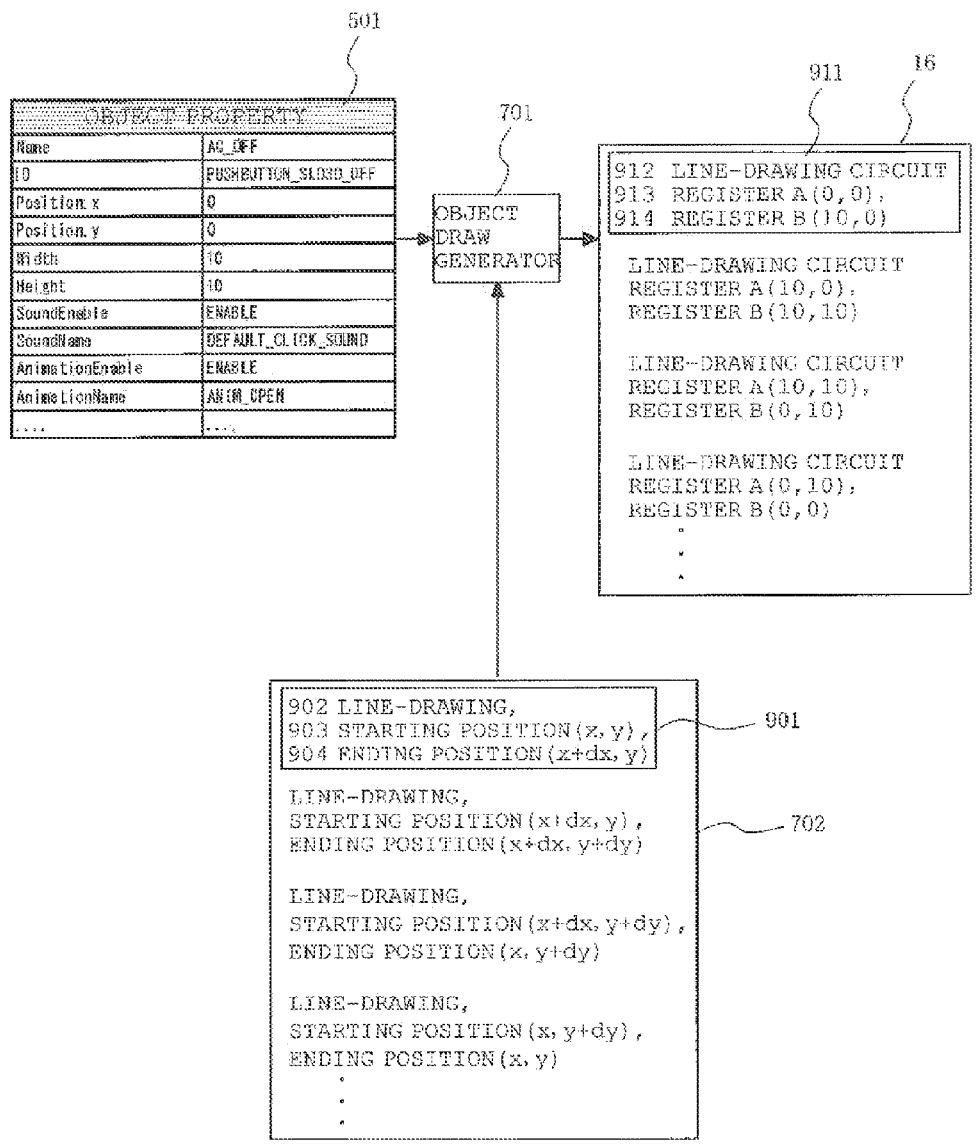
FIG. 9 is a diagram illustrating the operation of an object manager 6 according to Embodiment 4.

FIG. 9 illustrates the operation of the object manager 6 to issue a drawing command after reading out the object property 15. The object manager 6 passes the object property 15 to a suitable object draw generator 701 with reference to the type of the read-out object property 15. This processing is realized by arranging a chip-select terminal of the object draw generator 701 on a data bus connecting to the object database 9. The object draw generator 701 stores the object property 15 in a temporary storage circuit, such as a flip-flop circuit (not shown). When the reception of the object property 15 is completed, the object draw generator 701 reads the draw command template 702 in sequence from the first line. The stored draw command template 702 is in binary form. In FIG. 9, however, the meaning of the binary data is represented by Japanese for illustrative purposes. Two or more drawing commands are stored in the draw command template 702. The drawing command has one drawing element and two or more drawing arguments. For example, a drawing command 901 illustrated in the figure includes a drawing element 902, a drawing argument 903, and a drawing argument 904. The contents of the drawing command 901, "line-drawing, starting position (x,y), ending position (x+dx, y)", is written in binary form. The "line-drawing" of the drawing element 902 means drawing a line. Variable X and variable Y in the starting position of the drawing argument 903 have a value that represent an offset from the front address in the object property 15. Here, the draw command template 702 stores binary data. The binary data means that the variable X refers to the third element in the object property 15 and the variable Y refers to the fourth element therein. When the object draw generator 701 reads the binary data that means such reference, the object draw generator 701 reads out corresponding reference value from the object property 501 and the binary data that means the reference is then replaced with such a value. In this way, the binary data that means the reference is replaced and the completed drawing command is then output as a drawing command list 16 to the next circuit.

The drawing command list 16 includes a plurality of data. The drawing command list is binary data. In FIG. 9, the binary data is represented by Japanese for illustrative purposes. Data 911 includes a drawing circuit selection 912, a register value 913, and a register value 914. These data are transferred one line at a time to the graphics engine 7 via a bus or the like. The drawing command list 16, the drawing command template 702, and the object property 15 are temporarily stored in the memory (not shown).

In this way, the use of the drawing command template 702 allows a predetermined value of the object property 15 of the graphic object 100 to be replaced with part of the drawing command template 702 so as to complete the drawing command list 16. Thus, the drawing command of the graphic object 100 can be configured with a small number of instructions. By decreasing the number of instructions, the required scale of the circuit can be reduced.

In addition, to draw a graphic object configured by a plurality of graphic objects, the number of draw generators 701 to be totally required can be reduced using the reference type draw generator 703. Therefore, the required scale of the logic circuit can be reduced.

Embodiment 5

Referring now to FIG. 1 to FIG. 13, the graphics engine 7 according to Embodiment 5 of the present invention will be described in detail. The operation illustrated in FIG. 1 to FIG. 9 is the same as those described in Embodiment 1 to Embodiment 4, so that the description thereof will be omitted.

Figure 10:
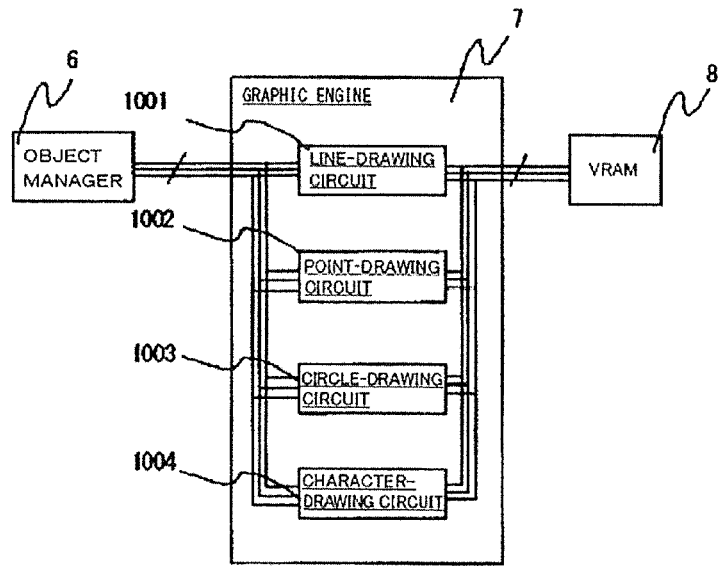
FIG. 10 is a diagram illustrating the configuration of a graphics engine 7 according to Embodiment 5.

FIG. 10 illustrates the configuration of the graphics engine 7. The graphics engine 7 includes a line-drawing circuit 1001, point-drawing circuit 1002, a circle-drawing circuit 1003, and a character-drawing circuit 1004 and so on. Drawing circuits are independently provided for the respective drawing elements, such as lines, points, circles, squares, and characters. The drawing circuits are configured on the basis of the Bresenham or Michener's algorithm, or the like. The drawing circuit is configured by a logic circuit. Each of the drawing circuits receives an input and then draws a graphics primitive on the VRAM 8. Here, the graphics primitive is a basic drawing element, such as a line, a point, a circle, a square, or a character.

The graphics engine 7 reads the drawing command list 16 issued by the object manager 6 and distributes commands to the respective drawing circuits. For example, a line-drawing command is distributed to the line-drawing circuit 1001 and a circle-drawing command is distributed to the circle-drawing circuit 1003. The distribution of commands is realized by providing each drawing circuit with a circuit select bit.

In this way, by distributing commands to a plurality of drawing circuits, similar drawing processing may reutilize the same logic circuit. For example, a button and a text box are different in shape but they can be drawn by repeating a point-drawing command and a line-drawing command several times in sequence. If drawing circuits dedicated to the respective graphic objects are prepared, the scale of the resulting circuit will be large. In contrast, the reutilization of such a drawing circuit can reduce the scale of the required drawing circuit.

Figure 11:
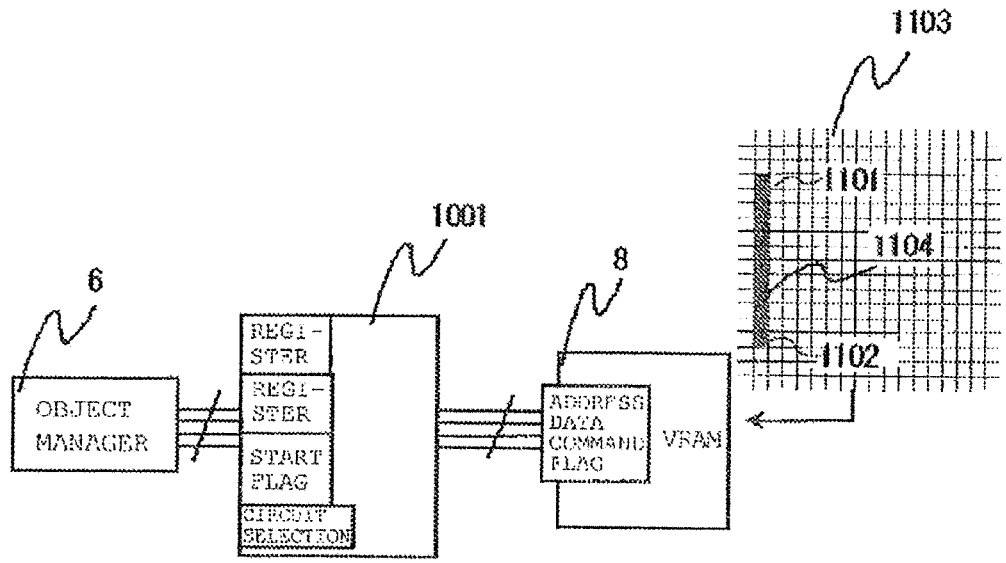
FIG. 11 is a diagram illustrating an example of the operation of a graphics engine 7 according to Embodiment 5.

FIG. 11 illustrates the operation of the line-drawing circuit 1001 of the graphics engine 7. Here, other drawing circuits have the same fundamental operation and configuration as those of the line-drawing circuit.

The line-drawing circuit 1001 employs two coordinate data of a starting position 1101 and an ending position 1102 as input values from the object manager 6. These values are stored in a predetermined register and while shifting coordinate positions in sequence from the input starting position 1101 to the ending position 1102 to configure a line on the VRAM 8. On the VRAM 8, addresses corresponding to the X coordinate and the Y coordinate of the liquid crystal display 12 are previously defined. The line-drawing circuit 1001 configures a memory image 1103 on the VRAM 8 by writing assigned color data for the corresponding address and draws a graphic primitive 1104.

Figure 12:
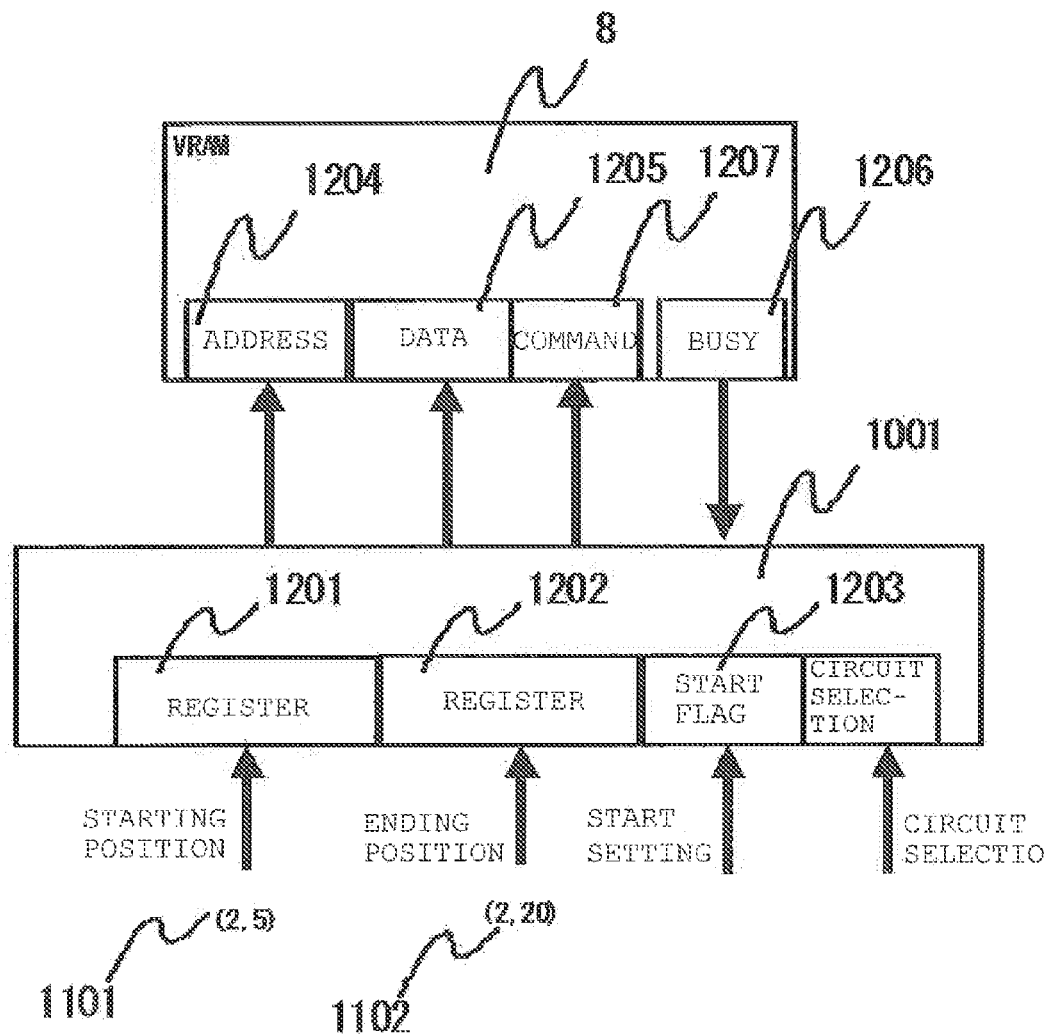
FIG. 12 is a diagram illustrating an example of the configuration of a graphic engine 7 according to Embodiment 5.

FIG. 12 illustrates the exchange of data between the line-drawing circuit 1001 and the VRAM 8. The drawing circuit such as the ling-drawing circuit 1001 has a register 1201 and a register 1202, which are registers dedicated to receive inputs. A start flag 1203 is on after setting values on the respective resisters to initiate a drawing processing. In the line-drawing circuit 1001, data is set at a predetermined address in the VRAM 8. Therefore, the VRAM 8 has an address resister 1204 for setting an address position and a data resister 1205 for receiving data to be set at the position. When the VRAM 8 receives the designation for writing to the memory, a busy flag 1206 is on until the completion of the writing. During that the busy flag 1206 is on, the line-drawing circuit 1001 waits for a next processing. When the busy flag 1206 is down, the next process is performed.

Figure 13:
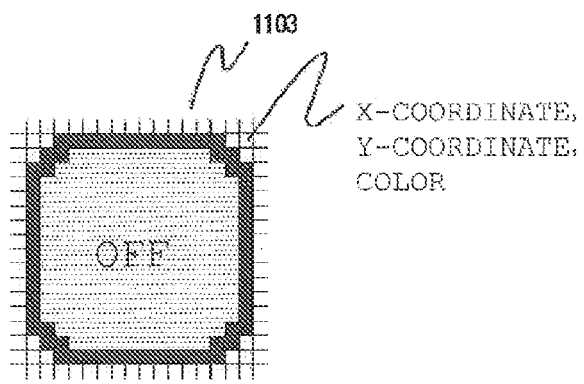
FIG. 13 is a diagram illustrating an example of a memory image 1103 according to Embodiment 5.

FIG. 13 illustrates an example of the memory image 1103 of the button graphic object 100 formed in the VRAM 8. Color information about drawing points is recorded in the VRAM 8. In the VRAM 8, the memory image 1103 is held on the whole screen and transferred to the LCDC 11 at a certain timing.

Embodiment 6

A facility appliance control device according to Embodiment 6 of the present invention will be described in detail with reference to FIG. 1 to FIG. 14. The operation of the semiconductor integrated circuit device illustrated in FIG. 1 to FIG. 12 is the same as that described in Embodiment 1 to Embodiment 5, so that the description thereof will be omitted.

Figure 14:
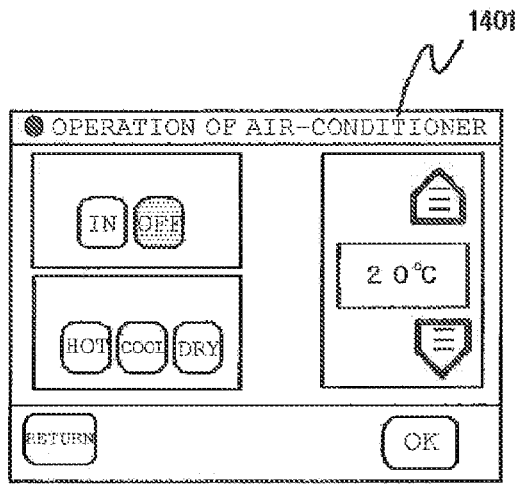
FIG. 14 is a diagram illustrating an example of an operation screen 1401 according to Embodiment 6.

FIG. 14 is an example of GUI screen of the facility appliance control device in which the semiconductor integrated circuit device 102 of the present invention is built-in. Here, an air-conditioning remote control will be described as an example of the facility appliance control device. An operation screen 1401 of the air-conditioning remote control includes a plurality of graphic objects 100 coexisting on a single screen. The object properties 15 of the respective graphic objects 100 are independently stored in the object database 9 as described above. An application program 101 that communicates with an air-conditioning machine is stored in the ROM 4 and executed by the application CPU 3. For example, when a user wants to turn on the power switch ("ON") of an air conditioner on the screen, the user only have to turn on the highlighted object property that corresponds to the "ON" button on the screen, while turning off the highlighted object property that corresponds to the "OFF" button on the screen.

The application program 101 is a program for making communication between an indoor unit and an outdoor unit of the air conditioner and assembling control commands thereof. For example, when the application program 101 receives room-temperature information from the indoor unit, the application program 101 updates the graphics property 15.

The application program 101 processes a user's input information entered from the screen and updates the graphic property 15. Then the information is reflected on the screen.

Furthermore, the graphic block 2 may be provided with an additional means for exclusively processing the input information entered by the user through the screen. In this case, there is no difference in that the value of the object property 15 in the object database 9 is finally updated.

As described above, by making the graphics block 2 perform processing related to the drawing of the graphic object 100, the control program implemented in the application block 1 can easily change the display screen only by changing the value of the object property 15 of the object database 9 arranged in the memory shared by these blocks. Therefore, by mounting the semiconductor integrated circuit device 102, the developer of the facility appliance control device such as an air-conditioning remote control can easily create a program that shows the state of the facility appliance through the screen to the user.

Embodiment 7

Figure 15:
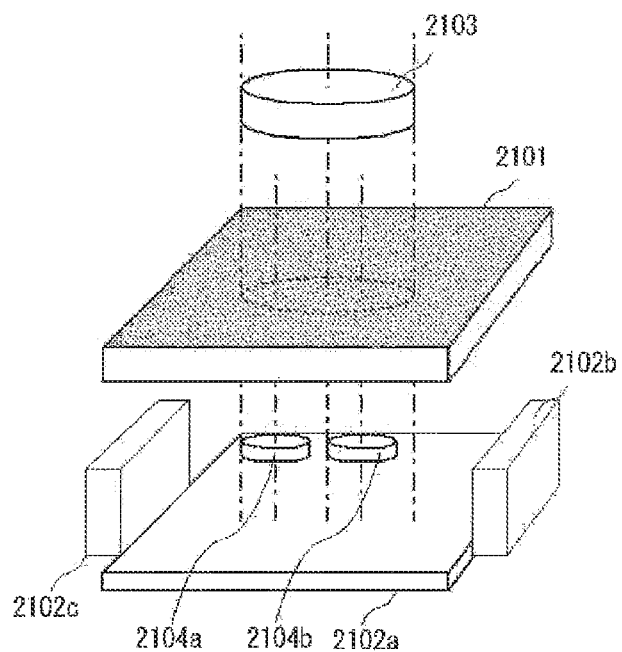
FIG. 15 is a schematic diagram illustrating Embodiment 7 of the present invention.

FIG. 15 illustrates a first embodiment of the present invention. The configuration includes a liquid crystal display unit 2101 and housing members 2102a, 2102b, and 2102c for supporting the liquid crystal display unit 2101. The device further includes a disk-shaped rotary operation body 2103 placed on the top of the liquid crystal display unit 2101 and magnetic sensors 2104a and 2104b placed on the top of the housing member.

Figure 16:
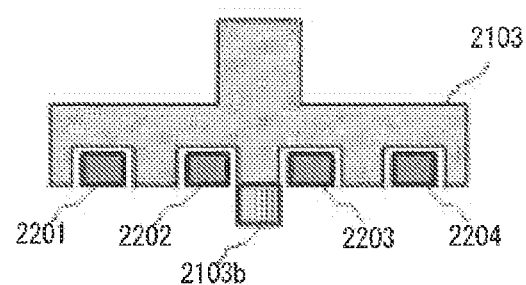
FIG. 16 is a diagram illustrating an Embodiment of the present invention.

FIG. 16 is a side view of the rotary operation body 2103. A rotation support 2103b is arranged under the rotation center portion. In addition, magnetic bodies 2201 to 2204 are circumferentially arranged along the lower surface. Furthermore, magnetic bodies 2205 to 2208 are also arranged not shown in the figure.

Figure 17:
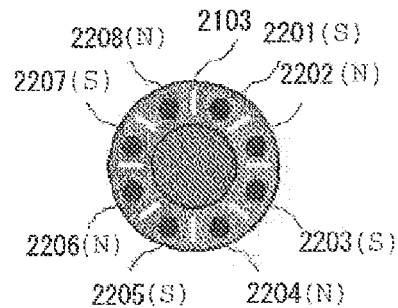
FIG. 17 is a diagram illustrating an Embodiment of the present invention.

FIG. 17 is a back view of the rotary operation body 2103. The magnetic bodies 2201 to 2208 are circumferentially arranged along the lower surface. The north (N) poles and the south (S) poles of the respective magnetic bodies are alternately arranged on the lower surface.

Here, the magnetic bodies 2201 to 2208 are supposed to be made of a rare-earth neodymium-based substance, a rare-earth samarium cobalt-based substance, or the like with a magnetic flux density of approximately 1000 [mT]. Alternatively, a tape-shaped magnetic film may be also applicable as long as what corresponds to such substances.

Figure 18:
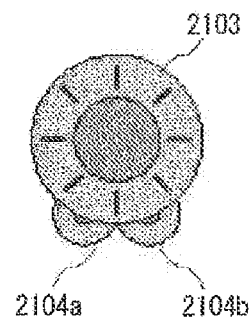
FIG. 18 is a diagram illustrating an Embodiment of the present invention.

FIG. 18 is a top view of the rotary operation body 2103 and represents the positional relationship between the rotary operation body 2103 and the magnetic sensors 2104a and 2104b. When the peripheral edge of the rotary operation body 2103 overlaps the axes of the magnetic sensors 2104a and 2104b as in the case of the present arrangement, the magnetic bodies 2301 to 2308 arranged on the back of the rotary operation body 2103 and the magnetic sensors 2104a and 2104b come closer to interact with each other. As a result, the sensitivities of the magnetic sensors 2104a and 2104b become maximum.

Figure 19:
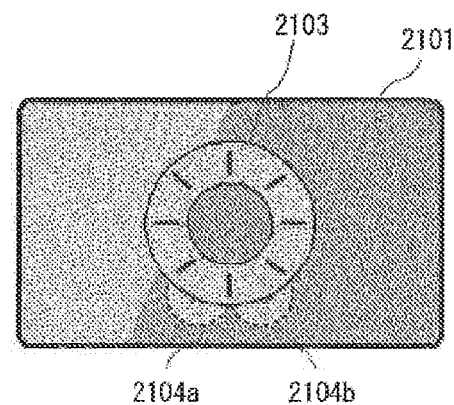
FIG. 19 is a diagram illustrating an Embodiment of the present invention.

FIG. 19 is a top view illustrating the rotary operation body 2103, the liquid crystal display unit 2101, and the magnetic sensors 2104a and 2104b hidden by the back of the liquid crystal display unit 2101. As shown in the figure, the rotary operation body 2103 and the magnetic sensors 2104a and 2104b are out of contact with each other through the intervention of the liquid crystal unit 2101.

Figure 20:
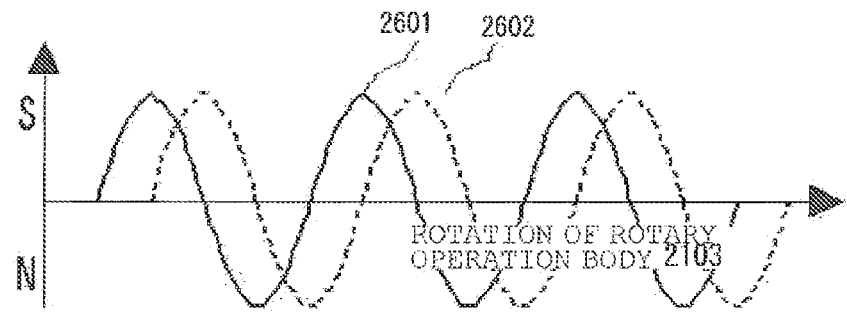
FIG. 20 is a diagram illustrating a magnetic field applied to a magnetic sensor.

FIG. 20 is a graph that represents the relationship between the rotation of the rotary operation body 2103 and the detecting status of the magnetic sensors 2104a and 2104b. The vertical axis represents a magnetic field where the positive direction shows the level of the S pole and the negative direction shows the level of the N pole. The horizontal axis represents the clockwise rotation of the rotary operation body 2103. Here, the curve 2501 shows a magnetic field strength applied to the magnetic sensor 2104a and a curve 2502 shows a magnetic field strength applied to the magnetic sensor 2104b. The magnetic field forms a cycle as the rotary operation body 2103 rotates in such a way that the magnetic substance 2201 arranged on the lower surface of the rotary operation body 2103 is changed into 2203 by passing 2202 by the criterion when located perpendicular to the magnetic sensor 2104b.

Figure 21:
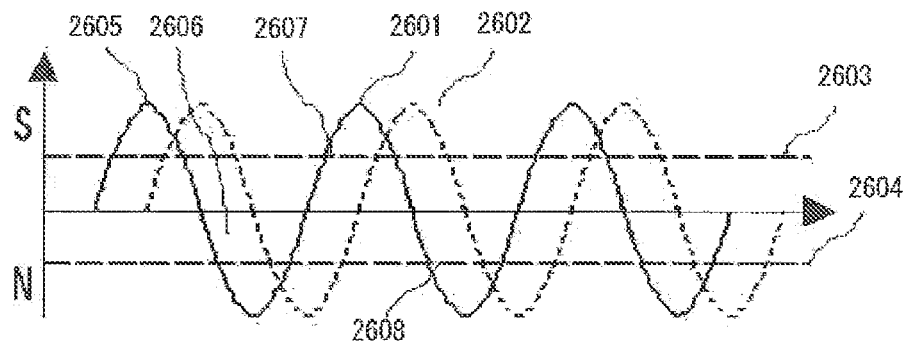
FIG. 21 is a diagram illustrating a magnetic field applied to a magnetic sensor.

In FIG. 21, the detection thresholds 2601 and 2602 of the magnetic sensors 2104a and 2104b are added. When exceeding the threshold values 2601 and 2602, the values of the magnetic sensors 2104a and 2104b represent change. Specifically, in the case of the magnetic sensor 2104a, the value of the magnetic sensor 2104a changes from 1 to 0 when the rotary operation body 2103 rotates, with the position 2605 being the criterion, up to the position 2606. Furthermore, when the rotary operation body rotates up to the position 2607, the value of the magnetic sensor 2104a changes from 0 to 1. In addition, at the position 2608, the value of the magnetic sensor 2104a changes from 1 to 0.

From a change in value of the magnetic sensor 2104a and a change in value of the magnetic sensor 2104b, since phase (time) in the horizontal direction of the graph in FIG. 21 is shifted. It is possible to estimate the rotation direction of the rotary operation body and the rotational speed of the rotary operation body can be estimated by the speeds of the above changes.

According to the present embodiment, when the small-sized rotary operation body 2103 is mounted on the upper surface of the liquid crystal display unit 2101, the rotational speed and the rotation direction of the rotary operation body 2103 can be detected without any wiring line to the upper surface of the liquid crystal display unit 2101. Therefore, by performing the rotational operation in the vicinity of the display contents of the liquid crystal display unit, an operator can intuitively understand the action on the display contents and the response representation.

In the present embodiment, the magnetic sensors 2104a and 2104b are arranged in the housing member 2102a, it may be fixed by screws or a liquid adhesive. Furthermore, the magnetic sensors 2104a and 2104b may be arranged on the lower surface of the liquid crystal display unit 2101 and fixed by screws or the liquid adhesive.

Embodiment 8

Figure 25:
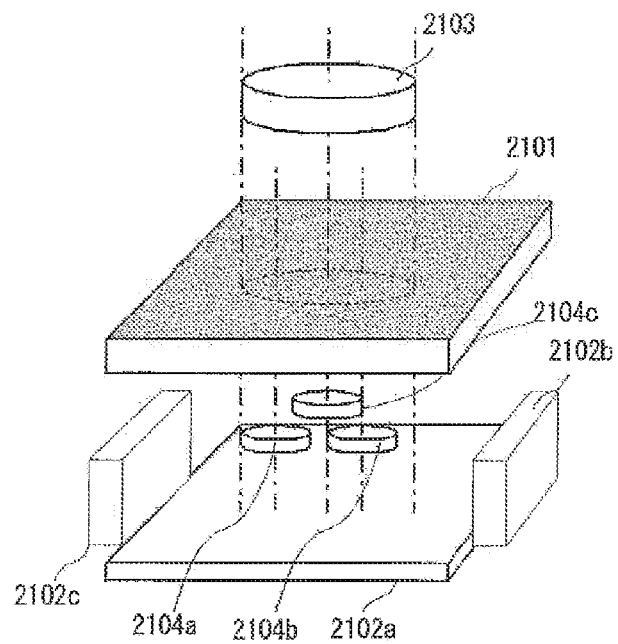
FIG. 25 is a diagram illustrating Embodiments 8 to 10 of the present invention.

FIG. 25 illustrates Embodiment 8 of the present invention. The configuration includes a liquid crystal display unit 2101 and housing members 2102a, 2102b, and 2102c for supporting the liquid crystal display unit 2101. The device further includes a disk-shaped rotary operation body 2103 placed on the top of the liquid crystal display unit 2101 and magnetic sensors 2104a, 2104b, and 2104c placed on the top of the housing member 2102a. Here, the position of the liquid crystal display unit 2101 along the plane direction of the magnetic sensor 2104c overlaps the rotation center of the rotary operation body 2103.

FIG. 17 to FIG. 19 also represent the present embodiment. The following components are the same as those of the Embodiment 1 of the present invention. The components include: the liquid crystal display unit 2101; the housing members 2102a, 2102b, and 2102c that support the liquid crystal display unit 2101; the disk-shaped rotary operation body 2103 placed on the upper surface of the liquid crystal display unit 2101; the magnetic sensors 2104a and 2104b arranged on the upper surface of these housing members; and the magnetic bodies 2201 to 2208 arranged on the lower surface of the rotary operation body 2103.

Figure 22:
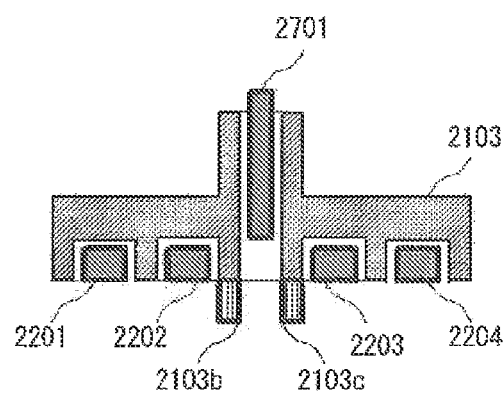
FIG. 22 is a diagram illustrating an embodiment of the present invention.

FIG. 22 illustrates the unique features of Embodiment 8 of the present invention. The rotation center of the rotary operation body 2103 has a hollow with a predetermined diameter of approximately 10 mm to 30 mm. A second magnetic body 2701 is placed in the hollow. In addition, the rotation support 2103b under the rotation center of the rotary operation body 2103 is in the form of a circle with a hollow almost corresponding to the diameter of the rotation center, so that 2103c part is shown in the side view.

According to the present embodiment, the second magnetic body 2701 is a moving part, so that it can be moved downward by being pushed down from the upper side of the figure. The movement causes a change in the magnetic field with the magnetic sensor 2104c in FIG. 15. The magnetic sensor 2104c can estimate the movement of the second magnetic body 2701 by detecting unusual change over a predetermined threshold.

In the present embodiment, for simplifying the explanation, by making the magnetic sensor 2104c placed near the center of the rotary operation body 2103 for the purpose of detecting the second magnetic body 2701, the influence of the magnetic bodies 2201 to 2200 is made small. However, the rotation state of the rotary operation body 2103 can be estimated from the detection results of the magnetic sensors 2104a and 2104b, the influence of the magnetic bodies 2201 to 2208 can be compensated even if such influence has occurred and the magnetic sensor 2104c may be not necessarily located near the center of the rotary operation body 2103.

Similarly, the magnetic sensors 2104a and 2104b do not detect binary levels of the predetermined thresholds but detect any variation in the magnetic field. Thus, the amount of change in the magnetic field can be estimated whether it is a phase component where the positional relationship among the magnetic bodies 2201 to 2208 is changed or it is a power component due to the positional change of the second magnetic body 2701. According to this method, the magnetic sensor 2104c is not indispensable.

Furthermore, the support of the second magnetic body 2701 may be provided with a spring to facilitate the second magnetic body 2701 to return upward in FIG. 22 or prevent it from jumping out.

Therefore, even if there is no special wiring line on the upper surface of the liquid crystal display unit 2101, the pushing down of the second magnetic body 2701 can be detected by the magnetic sensor 2104c on the lower surface of the liquid crystal. In addition, since the contents displayed by the liquid crystal display unit 2101 and the rotary operation body 2103 are close, an operator can intuitively understand the operation to the displayed contents and the response representation by operating the second magnetic body 2701 as a push-down button.

Embodiment 9

FIG. 25 illustrates Embodiment 9 of the present invention. The configuration includes a liquid crystal display unit 2101 and housing members 2102a, 2102b, and 2102c for supporting the liquid crystal display unit 2101, a disk-shaped rotary operation body 2103 placed on the top of the liquid crystal display unit 2101, and magnetic sensors 2104a, 2104b, and 2104c placed on the top of the housing member.

Here, the position of the magnetic sensor 2104c along a plane direction of the liquid crystal display unit 2101 overlaps the rotation center of the rotary operation body 2103.

FIGS. 17 to 19 also represent the present embodiment. The following components are the same as those of the Embodiment 1 of the present invention. The components include: the liquid crystal display unit 2101; the housing members 2102a, 2102b, and 2102c that support the liquid crystal display unit 2101; the disk-shaped rotary operation body 2103 on the upper surface of the liquid crystal display unit 2101; the magnetic sensors 2104a and 2104b arranged on the upper surface of the housing member; and the magnetic bodies 2201 to 2208 arranged on the lower surface of the rotary operation body 2103.

Figure 23:
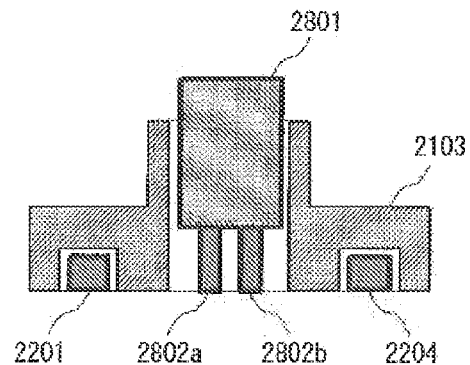
FIG. 23 is a diagram illustrating an embodiment of the present invention.

FIG. 23 illustrates the unique features of Embodiment 9 of the present invention. The rotation center of the rotary operation body 2103 has a hollow with a predetermined diameter of approximately 10 mm to 30 mm. A movable member 2801 is placed in the hollow. In addition, second magnetic bodies 2802a and 2802b in contact with the movable member 2801 are also placed in the hollow. The second magnetic body 2802a is joined so that it is in contact with the outer circumference of the movable member 2801. Also, the second magnetic body 2802b is in contact with the outer circumference of the movable part 2801 and joined almost at a position symmetric to the junction of the second magnetic body 2802a. In addition, the second magnetic bodies 2802a and 2802b are aligned so that their S poles direct upward and their N poles direct downward. However, the directions of the S and N poles may be changed.

Figure 24:
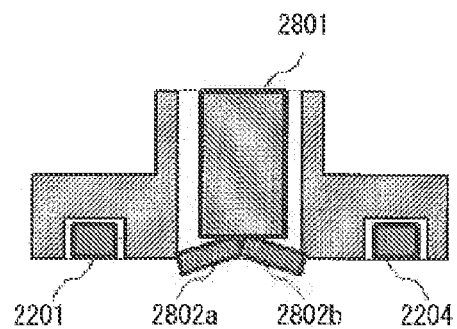
FIG. 24 is a diagram illustrating an embodiment of the present invention.

FIG. 24 illustrates the operating state of the present embodiment. The movable member 2801 is moved downward by being pushed down from the upper side of the figure. Therefore, it is arranged that the second magnetic bodies 2802a and 2802b are located below the hollow near the center of the rotary operation body, so that their N poles repel each other to extend outwardly at the lower part of the figure.

In the state illustrated in FIG. 23, the N poles of the second magnetic bodies 2802a and 2802b are aligned downward in the figure, however, there is no substantial influence of the N poles on the downward of the figure in the state of FIG. 24. Here, the magnetic sensor 2104c in FIG. 25 detects a large change in the magnetic field and estimates the movement of the movable member 2801.

In FIG. 23, a conical projection may be provided directly under the magnetic bodies 2802a and 2802b to facilitate the magnetic bodies 2802a and 2802b can be extended outwardly by pushing down the movable member 2801.

In the present embodiment, for simplifying the explanation, the magnetic sensor 2104c is placed near the center of the rotary operation body 2103 for the purpose of detecting the second magnetic bodies 2802a and 2802b to make the influence of the magnetic bodies 2201 to 2208 small. However, the rotation state of the rotary operation body 2103 can be estimated from the detection results of the magnetic sensors 2104a and 2104b. Thus, the influence of the magnetic bodies 2201 to 2208 can be compensated even if such influence has occurred, so that the magnetic sensor 2104c may be not necessarily located near the center of the rotary operation body 2103.

Similarly, the magnetic sensors 2104a and 2104b do not detect binary levels of the predetermined thresholds but detect any variation in the magnetic field. Thus, the amount of change in the magnetic field can be estimated whether it is a phase component where the positional relationship with the magnetic bodies 2201 to 2208 is changed with the rotation of the rotary operation body 2103 or whether it is a power component due to the directional changes of the second magnetic bodies 2802a and 2802b. According to this method, the magnetic sensor 2104c is not indispensable.

Furthermore, the support of the movable member 2801 may be provided with a spring to facilitate the second magnetic body 2701 to return upward in FIG. 22 or prevent it from jumping out of the hollow.

According to the present embodiment, even if the magnetism of the second magnetic bodies 2802a and 2802b are small, the magnetic sensors 2104a and 2104b can detect and estimate the movement of the movable member 2801 and even if the amount of movement of the movable member 2801 is small, the magnetic sensors 2104a and 2104b can detect and estimate the movement of the movable member 2801.

Embodiment 10

FIG. 25 illustrates Embodiment 10 of the present invention. The configuration includes a liquid crystal display unit 2101 and housing members 2102a, 2102b, and 2102c for supporting the liquid crystal display unit 2101, a disk-shaped rotary operation body 2103 placed on the top of the liquid crystal display unit 2101, and magnetic sensors 2104a, 2104b, and 2104c placed on the top of the housing member 2102a. Here, the position of the magnetic sensor 2104c along a plane direction of the liquid crystal display unit 2101 overlaps the circumference of the rotary operation body 2103 and the S pole of the magnetic body 2104c is arranged upward. Alternatively, it may be arranged downward.

FIG. 16 to FIG. 19 also illustrate the present embodiment. The following components are the same as those of the Embodiment 1 of the present invention. The components include: the liquid crystal display unit 2101; the housing members 2102a, 2102b, and 2102c that support the liquid crystal display unit 2101; the disk-shaped rotary operation body 2103 arranged on the upper surface of the liquid crystal display unit 2101; the magnetic sensors 2104a and 2104b arranged on the upper surface of this housing member; and the magnetic bodies 2201 to 2208 arranged on the lower surface of the rotary operation body 2103.

Here, when the rotary operation body 2103 is made to rotate, the magnetic bodies 2201 to 2208 apply the magnetic fields of the N and S poles alternately downward the lower surface of the rotary operation body. On the other hand, the magnetic body 2104c always applies the magnetic field of the S pole upward. The rotary operation body 2103 brings any of the magnetic bodies 2201 to 2208 close to the magnetic body 2104c according to the rotation angle, so that the degree of repelling of the magnetic field or attractive force varies. For example, because the lower side is the S pole, the magnetic body 2201 repels the magnetic body 2104c. In contrast, the magnetic body 2202 attracts the magnetic body 2104c because the lower side is the N pole. The magnetic body 2203 repels the magnetic body 2104c because the lower side is the S pole. The magnetic body 2204 attracts the magnetic body 2104c because the lower side is the N pole. In this way, the repelling and attracting are applied as the rotary operation body 2103 rotates, so that the operator of the rotary operation body 2103 obtains the sense of intermittent resistance, that is click feeling.

According to the embodiment of the present invention, even if there is no special wiring on the rotary operation body 2103 arranged on the upper surface of the liquid crystal display unit 2101, the magnetic sensors 2104a and 2104b on the lower surface of the liquid crystal can detect the rotation of the rotary operation body 2103. Since the rotary operation body 2103 is close to the contents displayed on the liquid crystal display unit 2101, an operator can intuitively understand the operation to the displayed contents and the response representation by rotary operation.

According to the embodiment of the present invention, even if there is no special wiring on the upper surface of the liquid crystal display unit 2101, the magnetic sensor 2104c on the lower surface of the liquid crystal can detect the pushing down of the second magnetic body 2701 and since the rotary operation body 2103 is close to the contents displayed on the liquid crystal display unit 2101, an operator can intuitively understand the operation to the displayed contents and the response representation by operating the second magnetic body 2701 as a push-down button.

According to the present embodiment, even if the magnetism of the second magnetic bodies 2802a and 2802b are small, the magnetic sensors 2104a and 2104b can detect and estimate the movement of the movable member 2801. In addition, even if the amount of movement of the movable member 2801 is small, the magnetic sensors 2104a and 2104b can detect and estimate the movement of the movable member 2801.

According to the embodiment of the present invention, the rotary operation body 2103 is subjected to repelling and attracting as it is made to rotate. Thus, an operator of the rotary operation body 2103 obtains the sense of intermittent resistance, that is click feeling.

REFERENCE NUMERALS 1 application block
2 graphic block
3 application CPU
4 ROM
5 RAM
6 object manager
7 graphic engine
8 VRAM
9 object database
10 CLK
11 LCDC
12 liquid crystal display
13 attribute value
14 trigger
15 object property
16 draw command list
17 address and data
301 graphic object 100
302 attribute
401 attribute value
501 object location
601 object property address
701 object draw generator
702 draw command template
703 reference type object draw generator
704 draw command template
901 drawing command
902 drawing element 903 drawing argument
904 drawing argument
911 data
912 drawing circuit selection
913 register value
914 register value
1001 line-drawing circuit
1002 point-drawing circuit
1003 circle-drawing circuit
1004 character-drawing circuit
1101 starting position
1102 ending position
1103 memory image
1104 graphic primitive
1201 register A
1202 register B
1203 start flag
1204 address register
1205 data register
1206 busy flag
1401 operation screen
2101 liquid crystal display unit
2102a-2102c housing member
2103 rotary operation body
2103b rotation axis for supporting a rotation operation body
2104a magnetic sensor
2104b magnetic sensor
2104c magnetic sensor or third magnetic body
2201-2208 magnetic body
2501 magnetic field strength
2502 magnetic field strength
2601 threshold of magnetic field
2602 threshold of magnetic field
2701 second magnetic body
2801 movable member
2802a second magnetic body
2802b second magnetic body

The invention claimed is:

1. A semiconductor integrated circuit device for configuring a graphic user interface, where a display element including a button or a text box composed of information including a character, a figure, or an image is referred to as a graphic object, comprising:
a database configured to store a plurality of object properties, wherein each object property includes attribute values pertaining to at least positions of respective graphic objects on a screen; and
an object manager that includes:
a draw command template including a plurality of drawing commands for drawing said graphic object, wherein each drawing command includes at least one variable for identifying corresponding attribute values in said object property, said at least one variable having a value that represents an offset from a front address of said object property, and
an object draw generator that
(i) reads out, from said draw command template, a variable representing an offset value,
(ii) reads out at least one attribute value from said object property based on said variable, and
(iii) outputs a drawing command by replacing the at least one variable in a drawing command in said draw command template with the corresponding at least one attribute value read out from said object property.

2. The semiconductor integrated circuit device of claim 1, further comprising
an application block having an application CPU on which an application program runs, wherein
a graphic block composed of said database, said graphic engine, and said object manager, and
said application block independently run, and said graphic block and said application block are provided on a single or a plurality of semiconductor chips.

3. The semiconductor integrated circuit device of claim 2, wherein said database is accessible from both said graphic manager and said application CPU.

4. The semiconductor integrated circuit device of claim 1, wherein
said database includes an object location for storing a position of said object property on a memory, and
said object manager acquires the position of the object property with reference to said object location.

5. The semiconductor integrated circuit device of claim 1, wherein
said object property further includes at least one of width, height, background color, existence of highlighting, picture image data, ID, and name of said graphic object.

6. The semiconductor integrated circuit device of claim 1, wherein
said object manager includes a reference type object draw generator that invokes said object draw generator.

7. The semiconductor integrated circuit device of claim 1, wherein
said object manager includes configuration information of said object property on a memory, and
when reading the attribute value of said object property, said object manager uses said configuration information to access a memory address in which said attribute value is stored.

8. The semiconductor integrated circuit device of claim 1, wherein
said graphic engine includes a drawing logic which is a logic circuit for drawing a primitive drawing element including a point, a line, a circle, a polygon, or a character; and
said graphic engine distributes drawing commands issued by said object manager into said drawing logic.

9. A facility appliance control device, comprising:
a semiconductor integrated circuit as described in claim 1; and
a facility appliance control program for air-conditioning and lighting, wherein
said facility appliance control program presents information about an appliance to a user by using said semiconductor integrated circuit device.

* * * * *